US012791636B2

(12) United States Patent
Gillinger

(10) Patent No.: US 12,791,636 B2
(45) Date of Patent: Nov. 10, 2026

(54) MAGNETORESISTIVE SENSORS AND ASSOCIATED PRODUCTION METHOD

(71) Applicant: Infineon Technologies AG, Neubiberg (DE)

(72) Inventor: Manuel Gillinger, Steindorf am Ossiacher See (AT)

(73) Assignee: Infineon Technologies AG, Neubiberg (DE)

( * ) Notice: Subject to any disclaimer, the term of this patent is extended or adjusted under 35 U.S.C. 154(b) by 189 days.

(21) Appl. No.: 18/782,481

(22) Filed: Jul. 24, 2024

(65) Prior Publication Data

US 2025/0060429 A1 Feb. 20, 2025

(30) Foreign Application Priority Data

Aug. 16, 2023 (DE) ......................... 102023121937.5

(51) Int. Cl.
*G01R 33/09* (2006.01)
*G01R 3/00* (2006.01)

(52) U.S. Cl.
CPC ............. *G01R 33/098* (2013.01); *G01R 3/00* (2013.01)

(58) Field of Classification Search
CPC .... G01R 3/00; G01R 33/098; G01R 33/0029; G01R 33/09; G01R 33/0023
See application file for complete search history.

(56) References Cited

U.S. PATENT DOCUMENTS

| | | | | |
|---|---|---|---|---|
| 6,104,231 | A | 8/2000 | Kirkpatrick, II | |
| 11,953,347 | B2 | 4/2024 | Umehara et al. | |
| 2017/0261306 | A1 | 9/2017 | Ausserlechner | |
| 2017/0322052 | A1 * | 11/2017 | Paul .................. | G01R 33/0005 |
| 2019/0235032 | A1 * | 8/2019 | Lassalle-Balier .... | G01R 33/093 |

FOREIGN PATENT DOCUMENTS

| | | | |
|---|---|---|---|
| DE | 69508250 | T2 | 9/1999 |
| DE | 102016104306 | A1 | 9/2017 |
| DE | 102018127279 | A1 | 5/2019 |

* cited by examiner

*Primary Examiner* — Tung X Nguyen
(74) *Attorney, Agent, or Firm* — Harrity & Harrity, LLP

(57) ABSTRACT

A magnetoresistive sensor contains a bridge circuit having at least one magnetoresistive resistor, wherein the bridge circuit is configured to provide a first differential analog output voltage. The magnetoresistive sensor also contains an amplifier circuit connected downstream of the bridge circuit, wherein the amplifier circuit is configured to provide a second differential analog output voltage based on the first differential analog output voltage provided by the bridge circuit. The second differential analog output voltage has a value of zero at a specified magnetic field strength not equal to zero. A common-mode voltage associated with the second differential analog output voltage corresponds to a specified percentage of a supply voltage of the bridge circuit.

19 Claims, 3 Drawing Sheets

MAGNETORESISTIVE SENSORS AND ASSOCIATED PRODUCTION METHOD

CROSS-REFERENCE TO RELATED APPLICATION

This application claims priority to Germany Patent Application No. 102023121937.5 filed on Aug. 16, 2023, the content of which is incorporated by reference herein in its entirety.

TECHNICAL FIELD

The present disclosure relates to magnetoresistive sensors and methods for producing magnetoresistive sensors.

BACKGROUND

Magnetoresistive sensors can be used in various technical applications. For example, magnetoresistive sensors are used in miniaturized camera modules, for example as may be contained in smartphones. In this context, target applications can be optical image stabilization, autofocus, or optical zoom, amongst others. Manufacturers and developers of magnetoresistive sensors constantly endeavor to improve their products. Among other things, it may be of interest to provide sensors with stable and precisely defined operating parameters, such as the power consumption of the sensor, for example.

SUMMARY

Various aspects relate to a magnetoresistive sensor. The magnetoresistive sensor includes a bridge circuit having at least one magnetoresistive resistor, wherein the bridge circuit is configured to provide a first differential analog output voltage. The magnetoresistive sensor also includes an amplifier circuit connected downstream of the bridge circuit, wherein the amplifier circuit is configured to provide a second differential analog output voltage based on the first differential analog output voltage provided by the bridge circuit. The second differential analog output voltage has a value of zero at a specified magnetic field strength not equal to zero. A common-mode voltage associated with the second differential analog output voltage corresponds to a specified percentage of a supply voltage of the bridge circuit.

Various aspects relate to a method for producing a magnetoresistive sensor. The method includes creating a bridge circuit having at least one magnetoresistive resistor, wherein the bridge circuit is configured to provide a first differential analog output voltage. The method further includes creating an amplifier circuit connected downstream of the bridge circuit, wherein the amplifier circuit is configured to provide a second differential analog output voltage based on the first differential analog output voltage provided by the bridge circuit. The second differential analog output voltage has a value of zero at a specified magnetic field strength not equal to zero. A common-mode voltage associated with the second differential analog output voltage corresponds to a specified percentage of a supply voltage of the bridge circuit.

BRIEF DESCRIPTION OF THE DRAWINGS

Devices and methods in accordance with the disclosure are explained in greater detail below with reference to drawings. Identical reference signs here may denote similar components. The features of the various examples illustrated can be combined with one another, provided that they are not mutually exclusive, and/or they can be selectively omitted if they are not described as absolutely necessary.

DETAILED DESCRIPTION

The magnetoresistive sensors described herein can be used in various technical applications. In one non-limiting example, the magnetoresistive sensors can be used in miniaturized camera modules, for example as may be contained in smartphones. Very recent technology in this field is based on actuator systems which are assembled from coils, magnets, and sensors. Such systems are able to detect positions, distances, and angles and use measured data to suitably move system components such as optical lenses, for example. In this context, target applications can be optical image stabilization, autofocus, or optical zoom, amongst others.

Figure 1:
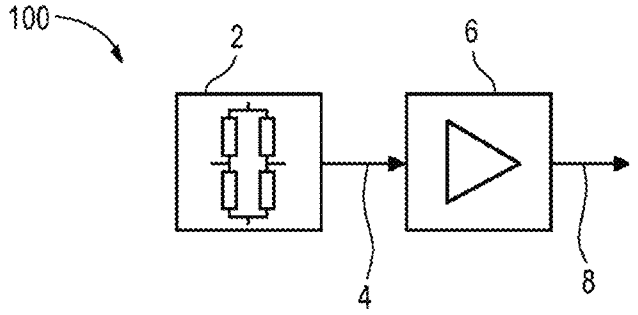
FIG. 1 shows a schematic illustration of a magnetoresistive sensor 100 in accordance with the disclosure.

The magnetoresistive sensor 100 of FIG. 1 is illustrated in a simplified form and described in order to qualitatively specify aspects of the disclosure. The magnetoresistive sensor 100 can be extended by one or more of the aspects described herein, as discussed, for example, in connection with FIG. 2.

The magnetoresistive sensor 100 can have a bridge circuit 2 having at least one magnetoresistive resistor. The simplified illustration of FIG. 1 only qualitatively indicates a structure of the bridge circuit 2. The bridge circuit 2 can be configured to provide a first differential analog output voltage 4. The magnetoresistive sensor 100 can further comprise an amplifier circuit 6 connected downstream of the bridge circuit 2. The amplifier circuit 6 can be configured to provide a second differential analog output voltage 8 based on the first differential analog output voltage 4 provided by the bridge circuit 2. The second differential analog output voltage 8 can have a value of zero at a specified magnetic field strength not equal to zero. Furthermore, a common-mode voltage associated with the second differential analog output voltage 8 can correspond to a specified percentage of a supply voltage of the bridge circuit 2.

Figure 2:
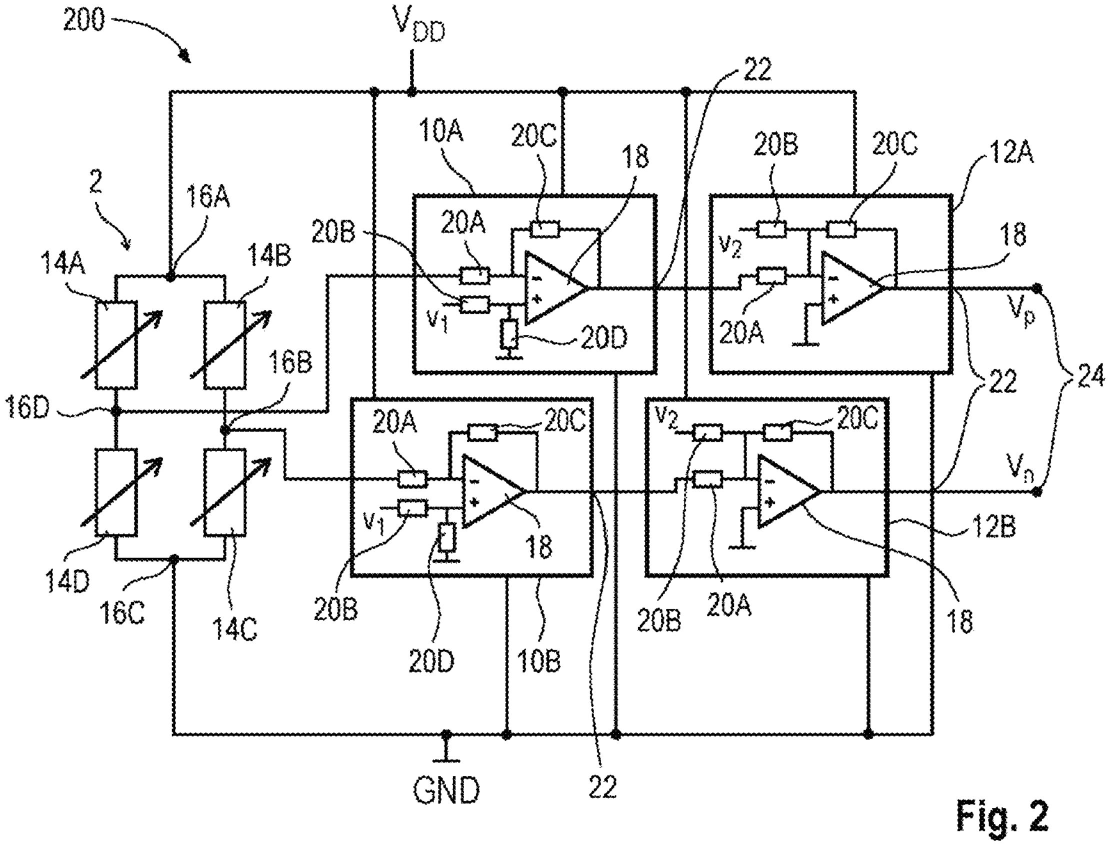
FIG. 2 shows a circuit diagram of a magnetoresistive sensor 200 in accordance with the disclosure.

The magnetoresistive sensor 200 of FIG. 2 can be regarded as a more detailed version of the magnetoresistive sensor 100 of FIG. 1. Accordingly, the magnetoresistive sensor 100 of FIG. 1 can be extended by one or more of the aspects described in FIG. 2. The magnetoresistive sensor 200 of FIG. 2 can comprise a bridge circuit 2, a first differential amplifier 10A, a first summing amplifier 12A, a second differential amplifier 10B and a second summing amplifier 12B. The components mentioned can be interconnected as shown in FIG. 2. Returning to the example of FIG.

1, the differential amplifiers 10A, 10B and the summing amplifiers 12A, 12B of FIG. 2 can form the amplifier circuit 6 of FIG. 1.

The bridge circuit 2 can have four resistors 14A to 14D and four nodes 16A to 16D. The bridge circuit 2 can be supplied with power by a supply voltage $V_{DD}$ via the nodes 16A and 16C. In particular, the entire supply voltage $V_{DD}$ (e.g., an entire portion of the supply voltage $V_{DD}$) can drop across the bridge circuit 2. The bridge circuit 2 can be configured to output a first voltage signal at the node 16B and a second voltage signal at the node 16D. Therefore, a differential analog output voltage can be tapped or measured at the two nodes 16B and 16D. This differential output voltage can be representative of a magnetic field strength prevailing at the location of the bridge circuit 2 (or a magnetic flux prevailing there).

In the example shown, the bridge circuit 2 can be equivalent to a Wheatstone bridge circuit. However, it must be noted that the Wheatstone bridge circuit of FIG. 2 is example and can be replaced by another half-bridge circuit or bridge circuit as long as it is configured to provide a differential analog output voltage that is representative of a magnetic field strength prevailing at the location of the bridge circuit 2.

At least one of the resistors 14A to 14D can be a magnetoresistive resistor. In the example shown, the bridge circuit 2 can comprise four magnetoresistive resistors 14A to 14D. The magnetoresistive resistors 14A to 14D are not restricted to any particular sensor technology. In the example shown, the magnetoresistive resistors 14A to 14D can be TMR (tunnel magnetoresistive) resistors. In other examples, the magnetoresistive resistors 14A to 14D can also be configured differently, for example as AMR (anisotropic magnetoresistive) resistors or GMR (giant magnetoresistive) resistors. For the sake of simplicity, only TMR resistors are discussed below. However, it should be noted that the following considerations can also be applied to other xMR resistors.

Each of the TMR resistors 14A to 14D can have two ferromagnetic layers, which can be separated by a non-magnetic, insulating tunnel barrier. One of the two ferromagnetic layers can correspond to a free layer with a direction of magnetization that can rotate freely in a magnetic field to be measured. The other ferromagnetic layer can be a pin layer (or a pinned layer) with a fixed reference magnetization that does not rotate when it is in the magnetic field to be measured. If the magnetization directions of the two ferromagnetic layers are parallel to one another, the electrical resistance of the tunnel barrier is low. Conversely, the resistance is high if the magnetization directions are antiparallel. The magnetoresistive sensor 200 can therefore convert a magnetic field to be measured into an electrical signal based on a TMR effect by changing the electrical resistance due to the changing angle of the free layer relative to the pin layer in response to the magnetic field.

In the case shown, the bridge circuit 2 can correspond, for example, to a Wheatstone bridge circuit, which can have opposite or anti-parallel sensitivity directions (or preferred directions) in the individual bridge branches. A sensitivity direction can in this case be specified as a direction in which a magnetic field can be measured with a maximum possible sensitivity. The four resistors 14A to 14D can have an identical nominal resistance magnitude and form two bridge branches with resistors 14A and 14D connected in series and resistors 14B and 14C connected in parallel therewith. The resistors 14A and 14C can have the same sensitivity direction, while the resistors 14B and 14D can have a sensitivity direction offset by 180° therefrom. An external magnetic field aligned in the sensitivity direction of the resistors 14B and 14D can cause resistance minimization in the resistors 14B and 14D and resistance maximization in the resistors 14A and 14C, such that a maximum or minimum output signal of the bridge circuit 2 can be obtained.

In a specific example, the resistors 14A to 14D of the bridge circuit 2 can be of identical construction. In other words, the resistors 14A to 14D can be based on the same or at least similar architecture. Accordingly, the resistors 14A to 14D can have the same or at least similar temperature coefficients. Measurement errors caused by temperature fluctuations can be avoided owing to the similar temperature coefficients.

The two differential amplifiers 10A and 10B can each be supplied with power by the supply voltage $V_{DD}$. The first differential amplifier 10A can contain an operational amplifier 18, which can be connected to resistors 20A to 20D, as shown in FIG. 2. The first differential amplifier 10A can be configured to receive at the inverting input of the operational amplifier 18 the voltage signal that is output at the node 16D of the bridge circuit 2. A voltage $V_1$ can be applied to the non-inverting input of the operational amplifier 18. The second differential amplifier 10B can be constructed in the same way as the first differential amplifier 10A and have the same or at least similar components. The second differential amplifier 10B can be configured to receive at the inverting input of its operational amplifier 18 the second voltage signal that is output at the node 16B of the bridge circuit 2. Each of the two differential amplifiers 10A and 10B can be configured to provide a processed output signal at its output.

The two summing amplifiers 12A and 12B can each be supplied with power by the supply voltage $V_{DD}$. The first summing amplifier 12A can be connected downstream of the first differential amplifier 10A and comprise an operational amplifier 18, which can be connected to resistors 20A to 20C, as shown in FIG. 2. The first summing amplifier 12A can be configured to receive at the inverting input of the operational amplifier 18 the voltage signal that is output by the first differential amplifier 10A. The non-inverting input of the operational amplifier 18 can be grounded. A voltage $V_2$ can be applied to the input resistor 20B. The second summing amplifier 12B can be constructed in the same way as the first summing amplifier 12A and have the same or at least similar components. The second summing amplifier 12B can be configured to receive at the inverting input of an operational amplifier 18 the voltage signal that is output by the second differential amplifier 10B. Each of the two summing amplifiers 12A and 12B can be configured to provide a voltage signal at its output.

During operation of the magnetoresistive sensor 200, a magnetic field present at the location of the bridge circuit 2 or at the positions of the resistors 14A to 14D can be detected by the bridge circuit 2. A differential analog voltage that is representative of the detected magnetic field can be provided at the two nodes 16B and 16D of the bridge circuit 2. A first voltage signal can be provided at the node 16D and fed into the first differential amplifier 10A connected downstream. In an analogous manner, a second voltage signal provided at the node 16B can be fed into the second differential amplifier 10B connected downstream.

The voltage signals fed into the differential amplifiers 10A and 10B can be processed by the differential amplifiers 10A and 10B, with each of the differential amplifiers 10A and 10B being able to output a processed voltage signal at its output 22. A differential analog voltage can therefore be provided at the outputs 22 of the two differential amplifiers 10A and 10B. The resistors 20A to 20D and the voltages $V_1$ of the two differential amplifiers 10A and 10B can be selected so that this differential analog voltage can have a value of zero at a specified or defined strength of the magnetic field detected by the bridge circuit 2. In other words, a differential analog voltage provided at the nodes 16B and 16D of the bridge circuit 2 with a value not equal to zero can be shifted to a value of zero using processing using the two differential amplifiers 10A and 10B. In one non-limiting case, for example, the differential analog voltage provided at the outputs 22 of the two differential amplifiers 10A and 10B can have a value of zero at a magnetic field strength of about 47MT. However, it should be noted that this specified value can be defined or selected in any other way in other examples, as required.

The voltage signals that are output at the outputs 22 of the two differential amplifiers 10A and 10B can be fed into the summing amplifiers 12A and 12B connected downstream and processed by them. A first voltage signal $V_p$ processed by the first summing amplifier 12A can be provided at its output 22 or an output 24 of the magnetoresistive sensor 200. In an analogous manner, a second voltage signal $V_n$ processed by the second summing amplifier 12B can be provided at its output or to a second output 24 of the magnetoresistive sensor 200. A differential analog output voltage $V_p-V_n$ can therefore be tapped at the outputs 24 of the magnetoresistive sensor 200.

A common-mode voltage $V_{CM}$ associated with the differential output voltage $V_p-V_n$ can be specified in accordance with $$V_{CM}=\frac{V_p+V_n}{2}.$$

The resistors 20A to 20C and the voltages $V_2$ of the two summing amplifiers 12A and 12B can be selected so that a common-mode voltage $V_{CM}$ corresponding to the differential output voltage $V_p-V_n$ corresponds to a specified percentage of the supply voltage $V_{DD}$. In one non-limiting case, the specified percentage can be an example and non-limiting value of approximately 70%, that is to say $V_{CM}\approx 0.7\cdot V_{DD}$ can hold true. However, it should be noted that this specified value can be defined or selected in any other way in other examples, as required.

In summary, signal processing using the two differential amplifiers 10A, 10B and the two summing amplifiers 12A, 12B can be used to convert the differential analog output voltage that is output by the bridge circuit 2 into a differential analog output voltage with a value of zero at a specified non-zero magnetic field strength and the common-mode voltage $V_{CM}$ of which corresponds to a specified percentage of the supply voltage $V_{DD}$. A desired magnetic zero point and a desired common-mode voltage can thus be easily adjusted via the properties of the two differential amplifiers 10A, 10B and the two summing amplifiers 12A, 12B. In the example shown, the summing amplifiers 12A and 12B are connected downstream of the differential amplifiers 10A and 10B. In other examples, the resistances and the voltages $V_1$, $V_2$ of the amplifiers can be adjusted in such a way that the sequence of the differential and summing amplifiers can be reversed.

The technical effects described below can be provided by magnetoresistive sensors in accordance with the disclosure. On the basis thereof, magnetoresistive sensors in accordance with the disclosure can surpass conventional magnetoresistive sensors in various aspects.

In order to be able to provide stable and precisely defined operating parameters of a magnetoresistive sensor, certain requirements for the sensor may need to be met. The operating parameters can be, for example, the power consumption or the differential analog output voltage of the sensor. According to a first example requirement, the differential analog output voltage of the sensor should be zero at a specified magnetic field strength. According to a second example requirement, the common-mode voltage of the sensor should correspond to a specified percentage of the supply voltage. As previously described, magnetoresistive sensors in accordance with the disclosure can meet these requirements in a simple and effective manner, thus contributing to providing stable and precisely defined operating parameters of the sensor.

The aforementioned requirements can be met in accordance with the disclosure, in particular based on a bridge circuit having four identical resistors. In contrast, conventional sensors may require more than four resistors for this. In one example, a fifth resistor connected in series with the bridge circuit can be used for this purpose in a conventional sensor. However, the fifth resistor can consume part of the supply voltage in an unfavorable manner. In contrast, in the case of a sensor in accordance with the disclosure, the entire supply voltage (e.g., an entire portion of the supply voltage $V_{DD}$) can drop across the bridge circuit. This means that the entire supply voltage can be used for the measurement sensitivity of the sensor, so that an improved measurement sensitivity can be provided in comparison with conventional sensors.

Other conventional sensors can meet the requirements only by using a bridge with four different resistors. The different resistors can have different temperature coefficients, which may result in measurement errors in the event of temperature fluctuations. In contrast, such measurement errors can be avoided in magnetoresistive sensors in accordance with the disclosure, since all four resistors of the bridge circuit can have the same or at least similar architecture.

Figure 3:
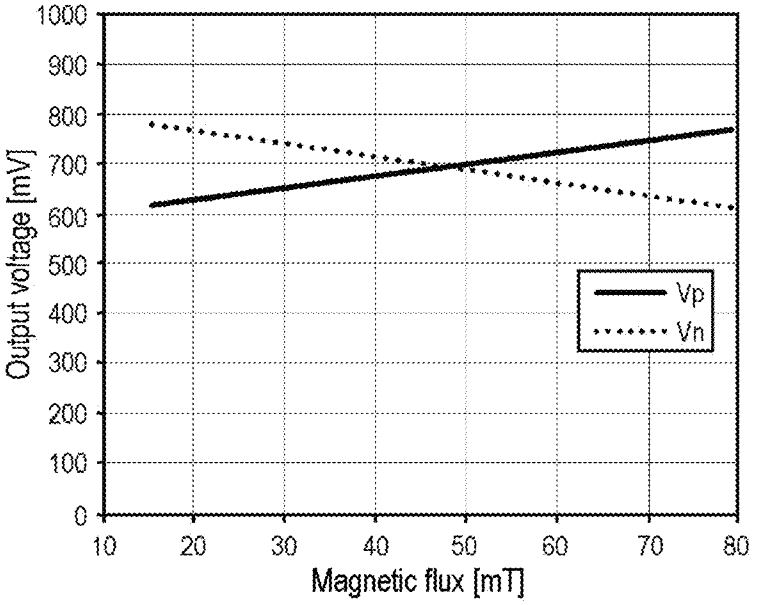
FIG. 3 shows profiles of output voltages of a magnetoresistive sensor in accordance with the disclosure.

FIG. 3 shows example profiles of output voltages $V_p$ and $V_n$ of a magnetoresistive sensor in accordance with the disclosure. In this case, the output voltages in mV are plotted against the magnetic flux or the magnetic field strength at the point of the bridge circuit of the magnetoresistive sensor in mT. The magnetoresistive sensor can be, for example, the magnetoresistive sensor 200 of FIG. 2. FIG. 3 shows that the output voltages $V_p$ and $V_n$ can have linear profiles with a positive or negative slope.

Figure 4:
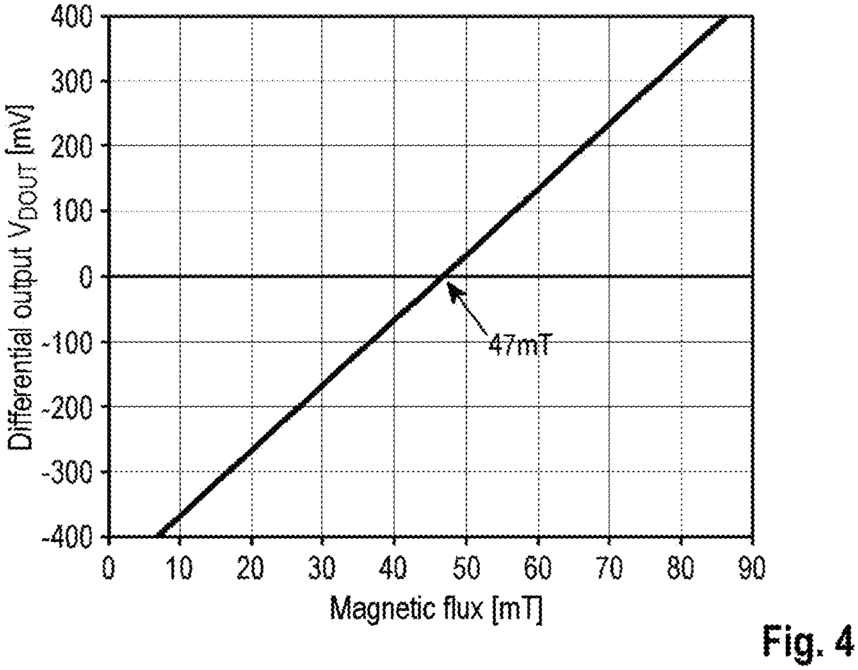
FIG. 4 shows a profile of a differential analog output voltage of a magnetoresistive sensor in accordance with the disclosure.

FIG. 4 shows an example profile of a differential analog output voltage of a magnetoresistive sensor in accordance with the disclosure. In this case, the differential analog output voltage $V_{DOUT}=V_p-V_n$ in mV are plotted against the magnetic flux or the magnetic field strength at the point of the bridge circuit of the magnetoresistive sensor in mT. FIG. 4 shows that the differential analog output voltage $V_{DOUT}$ can have a linear profile with a positive gradient. The magnetoresistive sensor can be a linear sensor. In particular, magnetoresistive sensors in accordance with the disclosure can be linear in-plane sensors. The differential output voltage $V_{DOUT}$ can have a value of zero at a specified magnetic field strength value. In the example shown, the specified magnetic field strength can have an example and non-limiting value of approximately 47 mT. In other examples, the specified value can be defined or selected in any other way as required.

Figure 5:
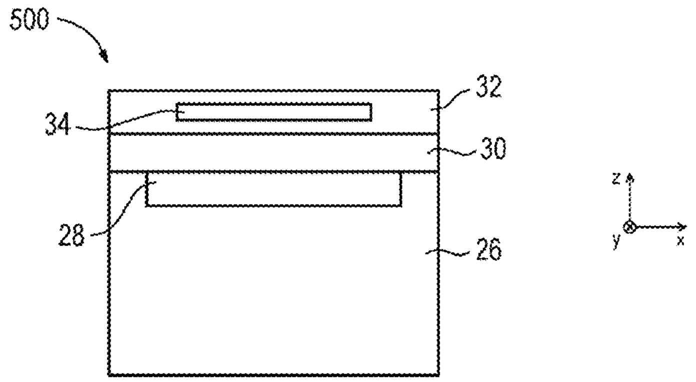
FIG. 5 schematically shows a cross-sectional side view of a magnetoresistive sensor 500 in accordance with the disclosure.

FIG. 5 shows an example structure of a magnetoresistive sensor in accordance with the disclosure. The layer structure shown in FIG. 5 is qualitative and simplified. It should be noted that the magnetoresistive sensor 500 can have further layers and components that are not shown in FIG. 5 for the sake of simplicity. The magnetoresistive sensor 500 can have one or more properties of magnetoresistive sensors described above. Conversely, previously described magnetoresistive sensors can be produced in accordance with the structure shown in FIG. 5.

The magnetoresistive sensor 500 can comprise a semiconductor material 26, an analog circuit 28, metal layers 30 and a layer 32 having one or more magnetoresistive stacks 34. The components mentioned can be arranged on top of one another, as shown in FIG. 5. The semiconductor material 26 can be selected arbitrarily and correspond to or comprise in particular silicon. The analog circuit 28 can be integrated into the semiconductor material 26 at the top side of the semiconductor material 26. In one example, the analog circuit 28 can be the amplifier circuit 6 of FIG. 1. In another example, the analog circuit 28 can contain the differential amplifiers 10A, 10B and the summing amplifiers 12A, 12B of FIG. 2.

Multiple magnetoresistive resistors, which can form a bridge circuit, can be formed in the layer 32 or the magnetoresistive stack 34. For example, the bridge circuit 2 formed can correspond to the bridge circuit of FIG. 2. An electrical connection of the magnetoresistive resistors to one another and/or an electrical connection of the bridge circuit formed to the analog circuit 28 can be provided at least in part by the metal layers 30.

The magnetoresistive stack 34 can be arranged at least in part above the analog circuit 28. When viewed in the z-direction, the analog circuit 28 and the magnetoresistive stack 34 can at least partly (or completely) overlap. In particular, the entire analog circuit 28 can be arranged below the layer 32 with the magnetoresistive stack 34, that is to say, when viewed in the z direction, the base surface of the analog circuit 28 can be completely contained within the base surface of the layer 32 or the base surface of the magnetoresistive layout. The analog circuit 28 can thus be realized without additional area consumption of the semiconductor material 26.

Figure 6:
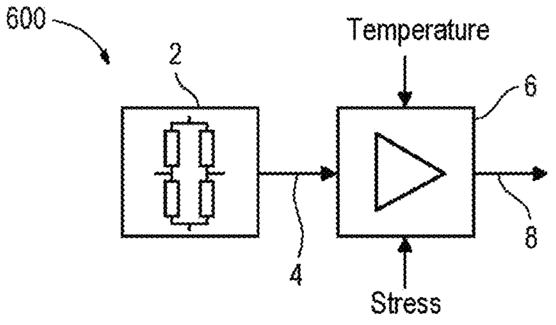
FIG. 6 shows a schematic illustration of a magnetoresistive sensor 600 in accordance with the disclosure.

The magnetoresistive sensor 600 of FIG. 6 can have one or more properties of magnetoresistive sensors described above. In addition to components described above, the magnetoresistive sensor 600 can have a compensation circuit, which can be configured to compensate for an influence of a temperature or a change in temperature and/or a mechanical stress on the first differential analog output voltage 4 or the second differential analog output voltage 8. In the example shown, the compensation circuit is not explicitly illustrated for the sake of simplicity. Instead, two arrows are shown to indicate the influence of a mechanical stress and temperature or change in temperature. The two arrows can also be considered as representative of a mechanical strain and a temperature or a change in temperature, based on which the compensation circuit can compensate for the influence of the mechanical stresses and the temperature or change in temperature.

Figure 7:
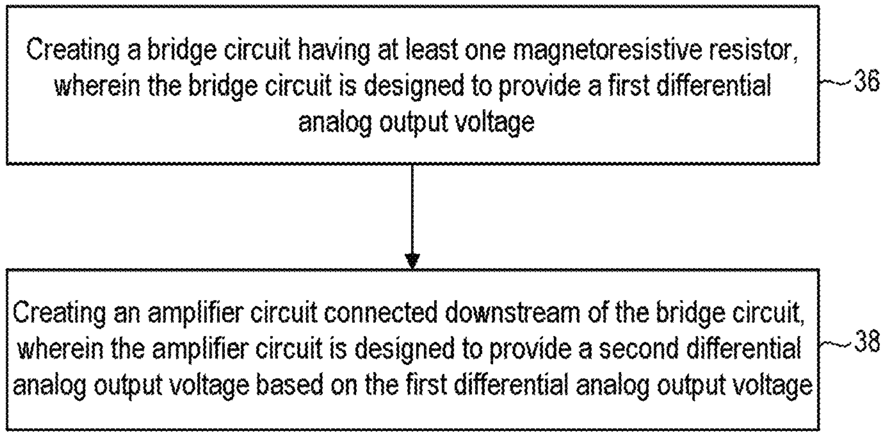
FIG. 7 shows a flow diagram of a method for producing a magnetoresistive sensor in accordance with the disclosure.

FIG. 7 shows a flow diagram of a method for producing a magnetoresistive sensor in accordance with the disclosure. The method can be used, for example, to manufacture any of the magnetoresistive sensors in accordance with the disclosure that are described herein. The method can therefore be read in conjunction with any of the preceding figures.

In 36, a bridge circuit having at least one magnetoresistive resistor can be created or formed. The bridge circuit can be configured to provide a first differential analog output voltage. In 38, an amplifier circuit connected downstream of the bridge circuit can be created or formed. The amplifier circuit can be configured to provide a second differential analog output voltage based on the first differential analog output voltage provided by the bridge circuit. The second differential analog output voltage can have a value of zero at a specified magnetic field strength not equal to zero. A common-mode voltage associated with the second differential analog output voltage can correspond to a specified percentage of a supply voltage of the bridge circuit.

ASPECTS

Magnetoresistive sensors in accordance with the disclosure and associated production methods are described below based on aspects.

Aspect 1 is a magnetoresistive sensor, comprising: a bridge circuit having at least one magnetoresistive resistor, wherein the bridge circuit is configured to provide a first differential analog output voltage; and an amplifier circuit connected downstream of the bridge circuit, wherein the amplifier circuit is configured to provide a second differential analog output voltage based on the first differential analog output voltage provided by the bridge circuit, wherein the second differential analog output voltage has a value of zero at a specified magnetic field strength not equal to zero, and wherein a common-mode voltage associated with the second differential analog output voltage corresponds to a specified percentage of a supply voltage of the bridge circuit.

Aspect 2 is a magnetoresistive sensor according to Aspect 1, wherein the bridge circuit comprises four magnetoresistive resistors.

Aspect 3 is a magnetoresistive sensor according to Aspect 1 or 2, wherein the at least one magnetoresistive resistor of the bridge circuit is a TMR resistor.

Aspect 4 is a magnetoresistive sensor according to any one of the preceding aspects, wherein the four magnetoresistive resistors of the bridge circuit are of identical construction.

Aspect 5 is a magnetoresistive sensor according to any one of the preceding aspects, wherein the amplifier circuit comprises: at least one differential amplifier, which is configured to provide a differential analog output voltage, which has a value of zero at the specified magnetic field strength, based on a differential analog voltage not equal to zero provided to the at least one differential amplifier; and at least one summing amplifier, which is configured to provide a differential analog output voltage, the associated common-mode voltage of which corresponds to the specified percentage of the supply voltage, based on a differential analog voltage provided to the at least one summing amplifier.

Aspect 6 is a magnetoresistive sensor according to Aspect 5, wherein the at least one summing amplifier is connected downstream of the at least one differential amplifier.

Aspect 7 is a magnetoresistive sensor according to any one of Aspects 1 to 4, wherein the amplifier circuit comprises: a first differential amplifier and a first summing amplifier, which are connected in series and are configured to output a first processed voltage signal based on a first voltage signal output from the bridge circuit, and a second differential amplifier and a second summing amplifier, which are connected in series and are configured to output a second processed voltage signal based on a second voltage signal output from the bridge circuit.

Aspect 8 is a magnetoresistive sensor according to any one of the preceding aspects, wherein the specified magnetic field strength is approximately 47mT.

Aspect 9 is a magnetoresistive sensor according to one of the preceding aspects, wherein the specified percentage is approximately 70%.

Aspect 10 is a magnetoresistive sensor according to any one of the preceding aspects, wherein the entire supply voltage drops across the bridge circuit.

Aspect 11 is a magnetoresistive sensor according to any one of the preceding aspects, comprising: a semiconductor material, wherein the amplifier circuit is integrated into the semiconductor material; and a magnetoresistive stack arranged above the amplifier circuit, wherein the amplifier circuit and the magnetoresistive stack at least partly overlap when viewed in a direction perpendicular to the magnetoresistive stack.

Aspect 12 is a magnetoresistive sensor according to any one of the preceding aspects, further comprising: a compensation circuit connected downstream of the bridge circuit, which is configured to compensate for an influence of a temperature and/or a mechanical stress on the first differential analog output voltage or the second differential analog output voltage.

Aspect 13 is a magnetoresistive sensor according to any one of the preceding aspects, wherein the magnetoresistive sensor is a linear in-plane sensor.

Aspect 14 is a magnetoresistive sensor according to any one of the preceding aspects, wherein the magnetoresistive sensor is configured to be integrated into a camera module of a smartphone.

Aspect 15 is a method for producing a magnetoresistive sensor, wherein the method comprises: creating or forming a bridge circuit having at least one magnetoresistive resistor, wherein the bridge circuit is configured to provide a first differential analog output voltage; and creating or forming an amplifier circuit connected downstream of the bridge circuit, wherein the amplifier circuit is configured to provide a second differential analog output voltage based on the first differential analog output voltage provided by the bridge circuit, wherein the second differential analog output voltage has a value of zero at a specified magnetic field strength not equal to zero, and wherein a common-mode voltage associated with the second differential analog output voltage corresponds to a specified percentage of a supply voltage of the bridge circuit.

Although specific implementations have been illustrated and described herein, it is obvious to a person of average skill in the art that a multiplicity of alternative and/or equivalent implementations can replace the specific implementations shown and described, without departing from the scope of the present disclosure. This application is intended to cover all adaptations or variations of the specific implementations discussed herein. Therefore, the intention is for this disclosure to be restricted only by the claims and the equivalents thereof.

What is claimed is:

1. A magnetoresistive sensor, comprising:

a bridge circuit having at least one magnetoresistive resistor, wherein the bridge circuit is designed to provide a first differential analog output voltage; and an amplifier circuit connected downstream of the bridge circuit, wherein the amplifier circuit is designed to provide a second differential analog output voltage based on the first differential analog output voltage provided by the bridge circuit, wherein the second differential analog output voltage has a value of zero at a specified magnetic field strength not equal to zero, and wherein a common-mode voltage associated with the second differential analog output voltage corresponds to a specified percentage of a supply voltage of the bridge circuit, wherein the amplifier circuit comprises:

at least one differential amplifier, which is designed to, based on a differential analog voltage not equal to zero provided to the at least one differential amplifier, provide a first corresponding differential analog output voltage that has a value of zero at the specified magnetic field strength; and at least one summing amplifier, which is designed to, based on a differential analog voltage provided to the at least one summing amplifier, provide a second corresponding differential analog output voltage, wherein a common-mode voltage of the second corresponding differential analog output voltage corresponds to the specified percentage of the supply voltage.

2. The magnetoresistive sensor as claimed in claim 1, wherein the bridge circuit comprises four magnetoresistive resistors.

3. The magnetoresistive sensor as claimed in claim 2, wherein the at least one magnetoresistive resistor of the bridge circuit is a TMR resistor.

4. The magnetoresistive sensor as claimed in claim 2, wherein the four magnetoresistive resistors of the bridge circuit are of identical construction.

5. The magnetoresistive sensor as claimed in claim 1. wherein the at least one summing amplifier is connected downstream of the at least one differential amplifier.

6. The magnetoresistive sensor as claimed in claim 1, wherein the amplifier circuit comprises:

a first differential amplifier and a first summing amplifier, which are connected in series and are designed to output a first processed voltage signal based on a first voltage signal output from the bridge circuit, and a second differential amplifier and a second summing amplifier, which are connected in series and are designed to output a second processed voltage signal based on a second voltage signal output from the bridge circuit.

7. The magnetoresistive sensor as claimed in claim 1, wherein the specified magnetic field strength is approximately 47 mT.

8. The magnetoresistive sensor as claimed in claim 1, wherein the specified percentage is approximately 70%.

9. The magnetoresistive sensor as claimed in claim 1, wherein an entire portion of the supply voltage drops across the bridge circuit.

10. The magnetoresistive sensor as claimed in claim 1, comprising:

a semiconductor material, wherein the amplifier circuit is integrated into the semiconductor material; and a magnetoresistive stack arranged above the amplifier circuit, wherein the amplifier circuit and the magnetoresistive stack at least partly overlap when viewed in a direction perpendicular to the magnetoresistive stack.

11. The magnetoresistive sensor as claimed in claim 1, further comprising:

a compensation circuit connected downstream of the bridge circuit, which is designed to compensate for an influence of a temperature and/or a mechanical stress on the first differential analog output voltage or the second differential analog output voltage.

12. The magnetoresistive sensor as claimed in claim 1, wherein the magnetoresistive sensor is a linear in-plane sensor.

13. The magnetoresistive sensor as claimed in claim 1, wherein the magnetoresistive sensor is designed to be integrated into a camera module of a smartphone.

14. A method for producing a magnetoresistive sensor, wherein the method comprises:

creating a bridge circuit having at least one magnetoresistive resistor, wherein the bridge circuit is designed to provide a first differential analog output voltage; and creating an amplifier circuit connected downstream of the bridge circuit, wherein the amplifier circuit is designed to provide a second differential analog output voltage based on the first differential analog output voltage provided by the bridge circuit, wherein the second differential analog output voltage has a value of zero at a specified magnetic field strength not equal to zero, wherein a common-mode voltage associated with the second differential analog output voltage corresponds to a specified percentage of a supply voltage of the bridge circuit, wherein the amplifier circuit comprises:

at least one differential amplifier, which is designed to, based on a differential analog voltage not equal to zero provided to the at least one differential amplifier, provide a first corresponding differential analog output voltage that has a value of zero at the specified magnetic field strength; and at least one summing amplifier, which is designed to, based on a differential analog voltage provided to the at least one summing amplifier, provide a second corresponding differential analog output voltage, wherein a common-mode voltage of the second corresponding differential analog output voltage corresponds to the specified percentage of the supply voltage.

15. A magnetoresistive sensor, comprising:

a bridge circuit having at least one magnetoresistive resistor, wherein the bridge circuit is designed to provide a first differential analog output voltage; and an amplifier circuit connected downstream of the bridge circuit, wherein the amplifier circuit is designed to provide a second differential analog output voltage based on the first differential analog output voltage provided by the bridge circuit, wherein the second differential analog output voltage has a value of zero at a specified magnetic field strength not equal to zero, and wherein a common-mode voltage associated with the second differential analog output voltage corresponds to a specified percentage of a supply voltage of the bridge circuit, wherein the amplifier circuit comprises:

a first differential amplifier having a first input coupled to a first output of the bridge circuit, a second input connected to a first voltage, and a first amplifier output configured to provide a first processed voltage; and a second differential amplifier having a third input coupled to a second output of the bridge circuit, a fourth input connected to the first voltage, and a second amplifier output configured to provide a second processed voltage, wherein the second differential analog output voltage is based on a difference between the first processed voltage and the second processed voltage.

16. The magnetoresistive sensor as claimed in claim 15, wherein the first differential amplifier includes a first operational amplifier having the first input, the second input, and the first amplifier output, and wherein the second differential amplifier includes a second operational amplifier having the third input, the fourth input, and the second amplifier output.

17. The magnetoresistive sensor as claimed in claim 16, wherein the first input is an inverting input of the first operational amplifier, and wherein the third input in an inverting input of the second operational amplifier.

18. The magnetoresistive sensor as claimed in claim 15, wherein the amplifier circuit comprises:

a first summing amplifier having a fifth input coupled to the first amplifier output of the first differential amplifier, a sixth input connected to ground, and a third amplifier output configured to provide a third processed voltage; and a second summing amplifier having a seventh input coupled to the second amplifier output of the second differential amplifier, an eight input connected to ground, and a fourth amplifier output configured to provide a fourth processed voltage, wherein the second differential analog output voltage is a difference between the third processed voltage and the fourth processed voltage.

19. The magnetoresistive sensor as claimed in claim 18, wherein the first summing amplifier and the second summing amplifier are configured such that the common-mode voltage associated with the second differential analog output voltage corresponds to the specified percentage of the supply voltage of the bridge circuit, and wherein the common-mode voltage is equal to an average of the third processed voltage and the fourth processed voltage.

* * * * *